(12) United States Patent
Barthel

(10) Patent No.: US 6,886,122 B1
(45) Date of Patent: Apr. 26, 2005

(54) METHOD FOR TESTING INTEGRATED CIRCUITS WITH MEMORY ELEMENT ACCESS

(75) Inventor: Dominique Barthel, Bernin (FR)

(73) Assignee: France Telecom, Paris (FR)

(*) Notice: Subject to any disclaimer, the term of this patent is extended or adjusted under 35 U.S.C. 154(b) by 0 days.

(21) Appl. No.: 09/936,487

(22) PCT Filed: Mar. 7, 2000

(86) PCT No.: PCT/FR00/00559

§ 371 (c)(1),
(2), (4) Date: Jan. 25, 2002

(87) PCT Pub. No.: WO00/54067

PCT Pub. Date: Sep. 14, 2000

(30) Foreign Application Priority Data

Mar. 8, 1999 (FR) .............................................. 99 02823

(51) Int. Cl.[7] .............................................. G01R 31/28
(52) U.S. Cl. ..................... 714/727; 714/726; 714/724; 714/718; 714/733; 716/18
(58) Field of Search ................................. 714/727, 726, 714/724, 733, 30, 731, 718, 740; 716/18; 324/158.1, 73.1; 712/220

(56) References Cited

U.S. PATENT DOCUMENTS

| | | | | |
|---|---|---|---|---|
| 5,509,019 A | * | 4/1996 | Yamamura | .................. 714/718 |
| 5,631,911 A | * | 5/1997 | Whetsel, Jr. | ................ 714/727 |
| 5,701,308 A | * | 12/1997 | Attaway et al. | ............ 714/740 |
| 5,983,379 A | * | 11/1999 | Warren | ........................ 714/727 |
| 6,085,336 A | * | 7/2000 | Swoboda et al. | ............. 714/30 |

* cited by examiner

Primary Examiner—Albert Decady
Assistant Examiner—Dipakkumar Gandhi
(74) Attorney, Agent, or Firm—Blakely Sokoloff Taylor & Zafman

(57) ABSTRACT

A method for testing an integrated circuit having memory elements which are written and/or read via an access path to the memory elements from a terminal external to the circuit. A boundary scan chain is activated to impose and/or observe logic levels on the integrated circuit inputs/outputs.

21 Claims, 3 Drawing Sheets

State of the art

State of the art

State of the art

State of the art

METHOD FOR TESTING INTEGRATED CIRCUITS WITH MEMORY ELEMENT ACCESS

The present invention relates to processes and devices for testing integrated circuits as well as the integrated circuits furnished with means permitting the carrying out of effective tests.

Two main processes for testing complex integrated logic circuits are known.

A first process, called the "full scan path automatic test pattern vector generation process" or "full scan ATPG" process is commonly used to test the fabrication of chips.

This process consists in injecting known signals onto pins of the integrated circuit and in tapping off the values obtained from the output pins, so as to compare them with expected values.

This process uses a tester whose channels are linked to the input/output pins of the integrated circuit. In order to implement this process correctly, one requires a tester having a number of channels equal to the number of input/output pins of the circuit.

With this process, one can test in particular a combinatorial logic function. Knowing the combinatorics, one can automatically generate the logic vectors which make it possible to verify in a quasi-exhaustive manner the correct implementation of the combinatorics.

However, when the function of the integrated circuit comprises memory elements, one cannot in general generate the test vectors. In certain rare cases where these vectors can be generated despite the presence of memory points, the number of test vectors is very high, so that a very long test sequence must be implemented, this being difficult to store in memory, difficult to manipulate, and requiring a great deal of on-tester time.

To avoid this drawback in the case of integrated circuits having memory points, one can set in place in the circuit an access path to the memory points which makes it possible to read and write from/to all these memory points, in such a way that the function of the integrated circuit is reduced, by controlling the memory points, to a combinatorial function which can be tested.

Customarily, the memory points are placed in series on the access path, this access path being reserved for the test. This path is called the "full scan path".

This access path adds a few inputs/outputs to the circuit.

This first process comprises a major drawback.

It necessitates a physical access, consisting of a channel of the tester, for each input/output of the integrated circuit. However, nowadays, the number of inputs/outputs of integrated logic circuits commonly exceeds several hundred, and will soon reach a thousand, and present-day testers can in practice only be made with a few hundred channels. Present-day testers are therefore becoming unsuitable for the integrated circuits to be tested.

More generally, the higher the number of channels of the testers, the more expensive the latter are.

This drawback is especially acute in the case of large-size circuits, which are most liable to exhibit operating faults. For such circuits, the test is carried out directly on a silicon slice, before lengthy and expensive mounting of the circuit in a package, which could turn out to be fruitless since the circuit might be defective. Such an on-slice test is carried out with the aid of a plugboard, whose cost and complexity of construction increase more quickly than the number of plugs, especially by reason of a plug coplanarity constraint.

For these reasons, this ATPG method is implemented by linking only some of the input/output pins to the tester. Certain inputs/outputs therefore remain untested, to the detriment of the quality of the fabrication test, and areas of the circuit remain untested.

Thus, represented in FIG. 3 is a circuit tested with this known process, on which are indicated, by the reference 10, the unconnected leads, and on which the untested areas have been hatched.

A second process for testing integrated circuits is known, which allows the checking and observation of logic levels on the inputs/outputs of a circuit, even when the interconnections of the package are not physically accessible. This process is used in particular in the case of a surface-mounted ball grid package (BGA package), or else in the case of a multilayer printed circuit.

This second type of test, called the "JTAG Boundary Scan", and defined by the "Joint Test Action Group", IEEE standard 1149.1, relates essentially to the testing of printed boards and of the soldering of integrated circuits onto these boards. This IEEE standard 1149.1 makes provision for an access path to the inputs/outputs which is able to substitute for a direct physical connection to the inputs/outputs.

This second type of test is implemented by adding logic specific to this test into the integrated circuit and into the printed board which carries it, this logic making it possible, under the control of a handler called the TAP controller ("Test Access Port controller"), to sense the logic level present on an input, and/or to impose the logic level on an output of the integrated circuit. In normal mode, this logic is transparent, both to the inputs and to the outputs.

Thus, the integrated circuits of a board are furnished with an access path having the form of a loop and linking in series the set of inputs/outputs of the relevant circuit, and the loops of each of the integrated circuits are linked in series.

The Boundary Scan chain therefore runs around the component into which it is integrated, and also runs around the board receiving the components. A general Boundary Scan chain links the Boundary Scan chains of each component in series, so that each input/output pad of each component as well as each track of the board is accessible from outside the board, via one and the same path from a specific terminal of the board, the transfer of the data sensed or to be imposed taking place in series in this path.

Through such arrangements, the Boundary Scan also permits the testing of the interconnections between the integrated circuits on a board. In this case, the test vector is loaded serially into the Boundary Scan path, then sent to the interconnections to be tested via output buffers of the components. The results are sampled in the Boundary Scan, via the inputs of the components, then output serially to the tester.

In an "internal test" mode, adapted for testing the components themselves, a test vector is loaded in series in the Boundary Scan path and then applied to the internal logic of the integrated circuit. The result is sampled in the Boundary Scan path, then read serially by the tester.

This second test process has drawbacks: it is especially lengthy to implement, particularly in the internal mode where the components of the board are tested. Moreover, this test process turns out to be especially unsuitable for the testing of integrated circuits before they are mounted, in particular for testing integrated circuits which comprise memory elements.

U.S. Pat. No. 5,850,513 also discloses a system allowing the checking of operational data of a circuit, including a maintenance subsystem, a flash memory, a controller, a processing unit, a main memory module, a data path network, means forming a dual bus, programmable logic control means, an auxiliary data transfer nozzle, and a series of input/output modules.

Together, these components process blocks of data of microcodes. The elements such as associated in this document, do not allow testing of the integrated circuit without multiple connections. This document does not therefore afford a satisfactory solution to the particularly lengthy implementation of customary testing processes.

The aim of the invention is to resolve these various drawbacks, by proposing a process for testing integrated circuits not requiring the connection of all the inputs/outputs of this circuit to a tester and making it possible to test an extended area, or even the entire circuit, it being possible moreover for this process to be carried out much faster than the known test processes.

Stated otherwise, the invention proposes to improve the coverage of an integrated circuit fabrication test as compared with the known full-scan ATPG method, without increasing the number of channels of the tester.

These aims are achieved according to the invention by virtue of a process for testing an integrated circuit comprising memory points and a Boundary Scan chain, in which one writes and/or reads to and/or from the memory points by way of an access path to the memory points from an outside terminal of the circuit, characterized in that the Boundary Scan chain is activated so as to impose and/or observe logic levels on the inputs/outputs of the integrated circuit.

Other characteristics, aims and advantages of the invention will become apparent on reading the detailed description which follows, with reference to the appended figures in which:

FIG. 1 diagrammatically represents a purely combinatorial integrated circuit in accordance with the state of the art;

Figure 1:
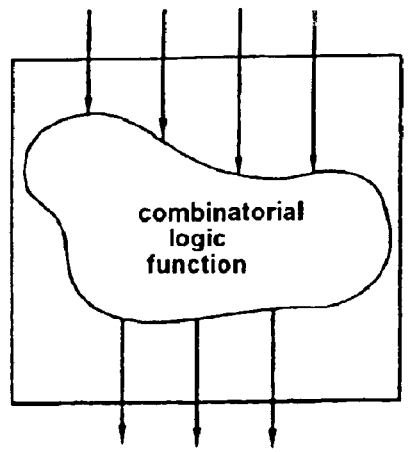
Figure 2:
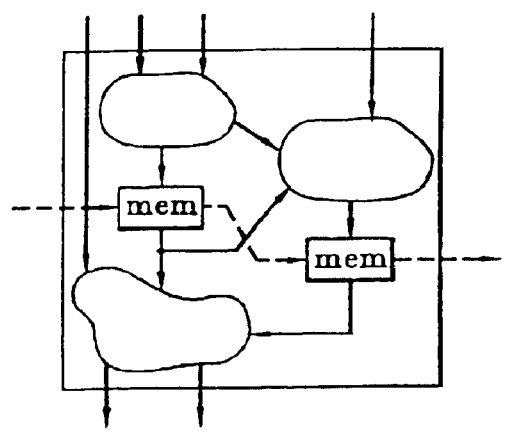
FIG. 2 represents an integrated circuit comprising combinatorial functions and memory elements in accordance with the state of the art.
Figure 3:
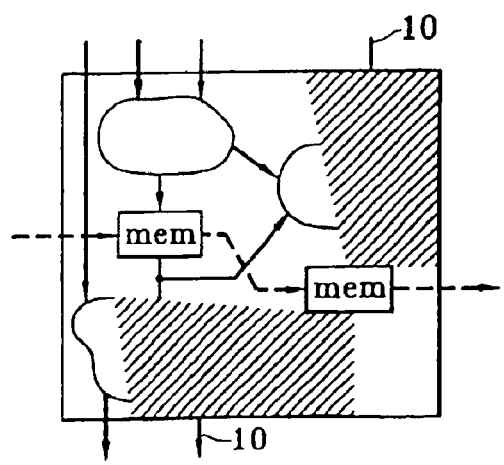
FIG. 3 represents the same circuit as in FIG. 2, wherein hatched areas indicate areas not tested when employing an ATPG process of the state of the art.
Figure 4:
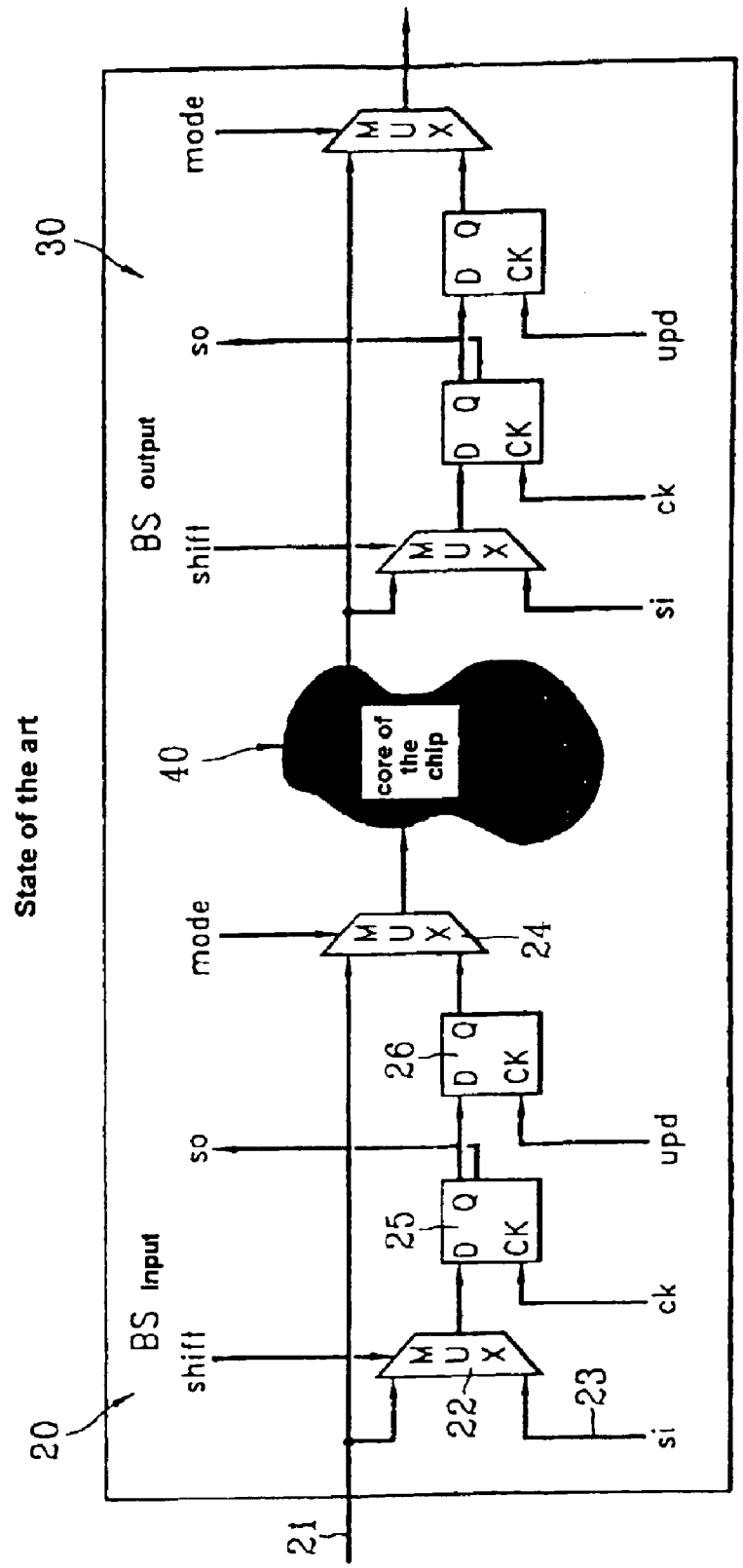
FIG. 4 represents an integrated circuit furnished with a Boundary Scan chain whose inputs and outputs have been represented in detail, in accordance with the state of the art.

Represented on the integrated circuit of FIG. 4 are three main parts: two Boundary Scan input/output modules 20 and 30, and between these two modules, a part 40 forming the core of the integrated circuit.

The two modules 20 and 30 represented here are identical to one another. Each of the two modules 20 and 30 is placed in parallel with a direct link between a connection pin and the core 40 of the chip.

Only the module 20 will be described, the module 30 comprising the same elements as the module 20.

The module 20 has two ends, each formed by a multiplexer 22, 24. On a link 23, a first 22 of these two multiplexers receives a control signal called "signal shift", which configures the cell as "shift" or as "load".

In the case of the cell 20 represented on the left in FIG. 4, the multiplexer 22 is able to receive a pin signal on its first input 21, this being for example a signal received from another chip of the board.

On a second input 23 of the multiplexer 22, the latter receives an input signal SI, carrying data transferred into the Boundary Scan chain and which data is intended to be loaded by the cell 20 if the latter is in "shift" mode.

Between the two multiplexers 21 and 24, the cell has two registers 25 and 26, one of which is a shift register 25 which delivers an output signal SO intended to be conveyed in the Boundary Scan to other input/output cells (not represented) of the chip 40, or else to other chips.

The shift register 25 also receives a clock signal denoted ck and the other register 26 receives a signal upd for updating the output latches of the cell 20, that is to say of memories of the cell 20 which are able to form a chosen logic level of this input or of this output of the integrated circuit, when this cell 20 is activated.

The shift register 25 also delivers a signal SO which contains, for certain cells, information captured on this cell and/or representative of data recorded in the cell 20, and possibly intended to be analyzed so as to interpret the test.

SI is therefore the serial data input, SO the serial data output.

The multiplexer 24 situated at the other end of the cell 20, that is to say between the cell 20 and the core 40 of the chip, receives a "mode" signal able to control the cell 20 so that the signal transmitted by the cell 20 to the core of the chip 40 is not the signal received on the pin 21 but the signal consisting of the content of the latches of the cell 20.

The signals SI and SO are conveyed through the integrated circuit, from input/output cell to input/output cell over the entire Boundary scan loop linking these inputs/outputs in series.

In a known manner, such an integrated circuit comprises a TAP controller, not represented, whose role is to generate the control signals SHIFT, UPD, CK and MODE for the Boundary Scan chain of the integrated circuit.

When testing a board, the TAP controller itself receives control signals flowing through the Boundary scan path of the board. The instructions relating to logic levels to be imposed on certain cells of its integrated circuit are transmitted to the TAP controller of the circuit by these control signals. Conversely, logic levels captured on certain cells are also transmitted in the Boundary Scan path by the TAP controller.

Figure 5:
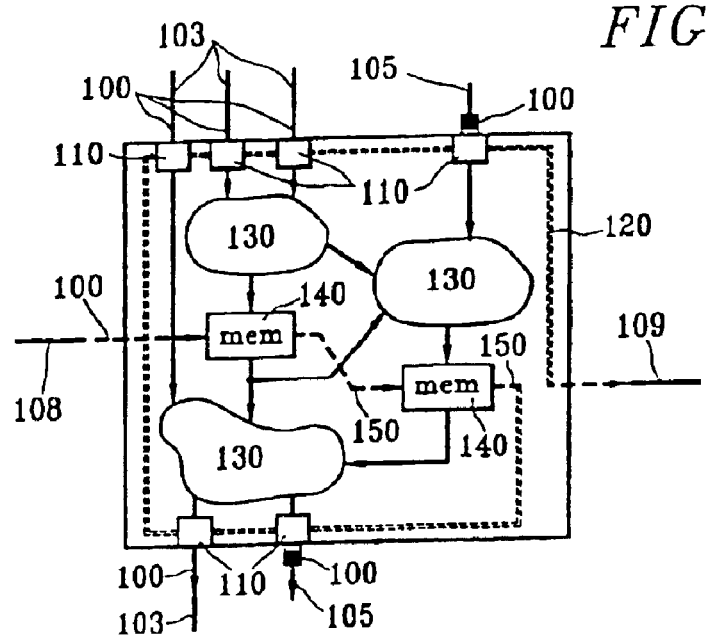
FIG. 5 represents an integrated circuit according to the invention, of which an access path to memory elements has been concatenated with a Boundary Scan path.

The integrated circuit according to the invention, which is represented in FIG. 5, comprises a set of pins 100 each associated with an input/output cell 110. The cells 110 are coupled in series by a Boundary Scan peripheral path 120, represented as a double dashed line. This peripheral path 120 therefore forms a loop 110 which runs around the perimeter of the circuit from input/output cell 110 to input/output cell 110.

This integrated circuit comprises combinatorial functions 130 and memory elements 140. The memory elements 140 are interlinked in series by a path 150 which makes it possible to access these memories from an outside pin 108. This path 150 makes it possible to control, during a test, the memories 140 directly from outside the circuit.

Among the pins 110, certain pins referenced 103 are linked to the channels of a tester (not represented) and other pins referenced 105 are not connected to the tester. The connected pins 103 are prolonged in FIG. 5 by a thick line, whereas the unconnected pins 105 merely have a short thin line.

In accordance with the invention, the testing of this integrated circuit is carried out by acting from outside on the memories 140, while activating the Boundary Scan path 120.

The path 150 is used either to place the memories 140 in a predetermined state, or else to capture their state in the course of the test. Simultaneously, the Boundary Scan path 120 is used to impose the predetermined logic levels on certain unconnected inputs/outputs 105 or to capture logic levels to be observed.

Thus, the memories 140 are acted on by way of the path 150 and the unconnected cells 105 are acted on by way of the Boundary Scan path 120.

In this mode of implementation of the invention, chosen signals are injected into the connected pins, 103 directly through the channels of the tester.

The Boundary Scan path 120 being connected to the tester, the tester dispatches into this path a signal chosen specifically to activate certain of the other cells 105 which are not connected and to impose a predetermined logic level on them.

By using both the Boundary Scan path 120 and a direct connection of the pins 103, the tester has access to all the pins 100 of the integrated circuit. Any desired test vector can therefore be applied to a set of pins which encompasses connected pins 103 and unconnected pins 105.

Predetermined levels are applied to groups of input/output pins 100 by combining an action by direct connection on certain pins with an indirect action on the inputs/outputs by way of the Boundary Scan 120.

The invention also envisages that no pin be acted on directly and that the logic levels of the inputs/outputs not be imposed or read other than by way of the Boundary Scan, whilst acting directly on the memory elements 140 of the circuit through one or more direct accesses to these memories 140.

In the case of a circuit with fifteen memory elements for example, it is possible to adopt fifteen paths for direct access to each of the memories, the Boundary Scan forming a sixteenth control path for elements of the circuit. Of course, it is also possible to place fifteen memory elements in series on one and the same path as in the case of FIG. 5.

In the exemplary embodiment of FIG. 5, the access path 150 to the memory elements 140 is concatenated with the Boundary Scan path 120 so that these two paths form one and the same chain on which both the memory elements 140 and also the input/output cells 110 are placed in series.

Thus, one acts on the memory points 140 and on the input/output cells 110 with the sole connection 108 outside the circuit, by injecting the serial data into this chain.

Figure 6:
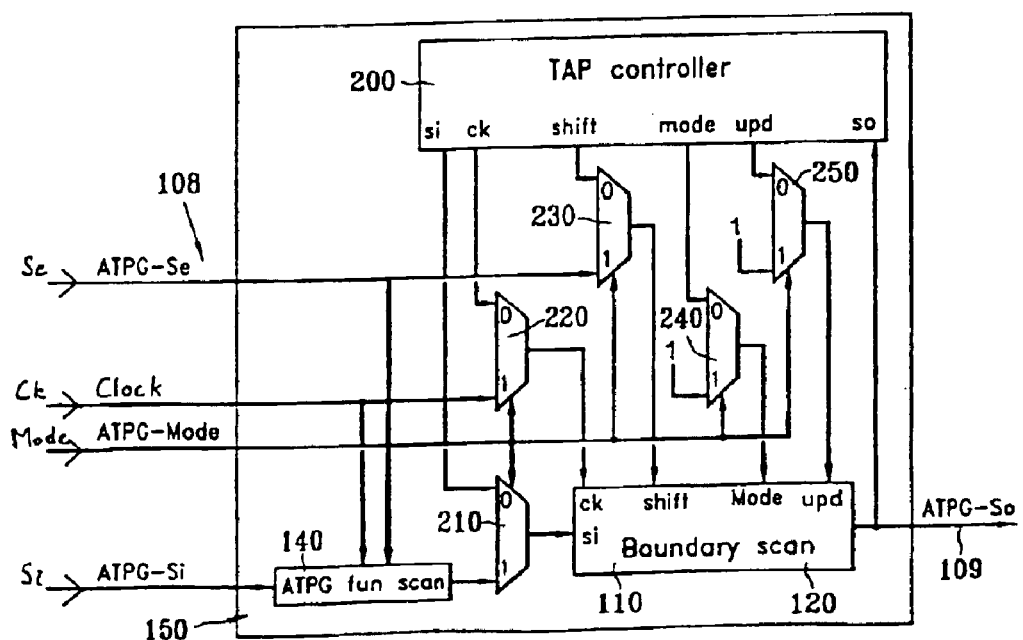
FIG. 6 represents an integrated circuit according to the invention, in accordance with that of FIG. 5, and whose means of connection between the access path to the memory elements and the Boundary Scan path have been represented.

Represented in FIG. 6 is a setup adapted to such concatenation of the Boundary Scan chain 120 and of the chain 150 for direct access to the memories 140. This preferred setup exhibits the advantage of leaving the Boundary Scan path 120 available to the TAP controller when not implementing the test process according to the invention and of making it possible to activate the Boundary Scan path 120 during a test of the integrated circuit carried out in accordance with the invention.

To do this, the chain 150 for access to the memories 140 is linked to the Boundary Scan chain 120 by way of at least one multiplexer controlled by a mode signal ATPG-mode, injected from the pin 108.

In a conventional manner, the Boundary Scan chain 120 comprises six links. In FIG. 6, the Boundary Scan path 120 has been depicted diagrammatically by a simple rectangle furnished with six connections corresponding to these links.

Likewise, the assembly formed of the access path 150 with its memory elements 140 has been represented by a simple rectangle referenced 150.

Represented in detail is the junction between the part of the Boundary Scan chain comprising the cells 110 in series, the TAP controller 200 and the access path 140 which here is also called the full-scan ATPG path by reference to the prior art.

This splice is situated downstream of the TAP controller 200 on the Boundary Scan chain and downstream of the memory points 140 on the access path 150.

In this setup, the pin 108 forms the outside end of a set of four links flowing parallel to one another on the path 150 up to this junction.

These four links are:

an ATPG-si link able to transmit an information carrier signal to the memory elements 140 and to the cells 110, controlling states of certain memories 140 or logic levels of certain inputs/outputs 110 which are able to recognize the signals which are specifically intended for them. This ATPG-si channel carries between the pin 108 and its junction with the Boundary Scan chain the memory elements 140 arranged in series;

an ATPG-se link able to transmit to the Boundary Scan a "shift" or "load" configuring signal SE for the chosen cells of the Boundary Scan;

a CLOCK link able to transport a clock signal CK to the various elements of the Boundary Scan, and;

an ATPG-mode link able to convey a control signal MODE indicating whether the Boundary Scan 120 is to be linked to the controller 200 or else to the chain for access to the memories 150. In the latter case, the Boundary Scan chain 120 is linked in series to the ATPG chain 150.

The ATPG-mode link is linked to five multiplexers (or equivalent functions), each time constituting a control channel thereof.

A first multiplexer 210 receives on a first input the signal SI conveyed on the ATPG-Si link and receives on a second input an input signal SI originating from the TAP controller 200.

On its two inputs a second multiplexer 220 respectively receives the clock signal CK coming from the pin 108 and another clock signal CK coming from the controller 200.

On its inputs a third multiplexer 230 respectively receives the signal SE originating from the pin 108 and the signal SHIFT coming from the controller 200.

On its two inputs a fourth multiplexer 240 respectively receives the mode signal originating from the controller 200 and a constant activation signal denoted "1".

On its two inputs a fifth multiplexer 250 respectively receives the updating signal UPD originating from the controller 200 and a constant activation signal denoted "1".

When the mode signal which is injected into the pin 108 on the ATPG-mode link is at 0, the SI, MODE, Shift, CK and UPD links of the Boundary Scan 120 are linked, as in an ordinary circuit, to the controller 200.

Stated otherwise, when no activated test mode signal is transmitted in the pin 108, the Boundary Scan 120 is linked to its control device 200 contrived for carrying out a standard Boundary Scan test.

On the other hand, when a test activation signal is transmitted on the ATPG-mode channel of the pin 108, the SI, CK, SHIFT channels of the Boundary Scan 120 are linked respectively to the signals SI, CK, SE applied respectively to the ATPG-Si, Clock and ATPG-Se links of the pin 108, whilst the MODE and UPD links of the Boundary Scan 120 are linked to the constant activation values equal to 1.

Thus, when the ATPG-mode link of the pin 108 receives an activation signal, the Boundary Scan path 120 and the cells 110 which it comprises are controlled by the signals SI, CK and SE applied to the pin 108 from outside.

In this same case, the signal MODE and the signal UPD which are received by the Boundary Scan chain 120 are the permanent activation signals so that the content of the latches of the input/output cells of the Boundary Scan is substituted for the signals normally tapped off from the pins of these cells during the test according to the invention.

It will be noted that the access path 150 to the memories 140 is permanently linked to the clock input of the pin 108, unlike the Boundary Scan 120 which is tied to the clock signal of the controller 200 or of the pin 108 according to the content of the mode signal applied to the pin 108.

The output of the Boundary Scan chain 120 forms a pin 109 and also carries a link linking this pin 109 to the controller 200, so that the output signal SO from the Boundary Scan 120 is looped back onto the controller 200.

During the test according to the invention, a tester connected to the ATPG-Se, Clock, ATPG-mode and ATPG-Si inputs of the pin 108 activates the concatenated chain comprising the memories 140 in series with the cells 110, and applies a chosen state to the memories 140, imposes a chosen signal on chosen inputs/outputs 100 of the integrated circuit by way of the Boundary Scan chain, and captures signals obtained on inputs/outputs 100 of the integrated circuit by way of the Boundary Scan chain 120, as well as on the pin 109.

Hence, during the testing of the integrated circuit one uses logic present in the circuit, which logic was used hitherto to access inputs/outputs of the circuit which were inaccessible in particular when this circuit was mounted on a board. The coverage of the testing of a complex integrated logic circuit having numerous inputs/outputs is therefore increased.

A few extra logic gates are added to the circuit so as to couple the Boundary Scan chain 120 to the full-scan ATPG chain, place it in non-transparent mode and couple its clock to the ATPG test clock when the test according to the invention is implemented.

The tester is advantageously furnished with a few channels wired directly to input/output pins 100 of the circuit.

The tester then comprises a module for injecting test signals directly into inputs/outputs linked to these channels and for receiving signals leaving these inputs/outputs 100, and for comparing them with expected signals. The tester then comprises a device for controlling the Boundary Scan chain 120 of the integrated circuit which is coordinated with the direct injection/reception module so as to generate test vectors on sets comprising both inputs/outputs 103 connected directly to the tester and also inputs/outputs 105 connected to the tester via the Boundary Scan chain 120.

In the case of such an association of direct injections and injections by way of the Boundary Scan chain, the test makes it possible to test all the parts of the circuit and turns out to be especially fast, effective, owing in particular to the fact that one uses a tester which has an acceptable number of channels and allows fast and fuller testing of the circuit.

The injecting of the test vectors by the association of direct injection into the pins and of injection by way of the Boundary Scan chain may even be adopted without resorting to intervention on the memory points.

The concatenating of the ATPG 150 and Boundary Scan 120 chains makes it possible more generally to act on the memories 140 and on the input/output cells 110 through one and the same input 108, with one and the same signal generator.

By virtue of the invention, the number of checking and observation points is increased, and hence the coverage of the test in the vicinity of the inputs/outputs which are left unconnected is improved.

The invention improves the testability in the vicinity of the bidirectional inputs/outputs, even those connected to a channel of the tester, since it provides test access to an intermediate point which according to IEEE standard 1149.1 must form part of the boundary scan chain, namely the direction signal.

What is claimed is:

1. Process for testing an integrated circuit comprising memory points and a Boundary Scan chain, in which one writes and/or reads to and/or from the memory points by way of an access path to the memory points from an outside terminal of the circuit, comprising:
    activating the Boundary Scan chain so as to impose and/or observe logic levels on the inputs/outputs of the integrated circuit.

2. Process according to claim 1, characterized in that the access path to the memory points and the Boundary Scan chain are activated simultaneously.

3. Process according to claim 1 or 2, characterized in that the access path to the memory points and the Boundary Scan chain are activated by way of a line comprising in series the access path to the memory points and the Boundary Scan chain.

4. Process according to claim 1 or claim 2, characterized in that the Boundary Scan chain is activated by way of an activation path linked to the Boundary Scan chain downstream of a TAP controller.

5. Process according to claim 4, characterized in that the activation path is linked to the Boundary Scan chain at least by a logic gate able to link, as a function of a control signal (ATPG-mode), the Boundary Scan chain or else to the activation path of the Boundary Scan, or else to the TAP controller.

6. Process according to claim 4, characterized in that the activation path includes at least one channel (ATPG-Si) on which is placed at least one memory point, this channel being able to be linked in series with the Boundary Scan chain when the latter is activated.

7. Process according to claim 1 or claim 2, characterized in that the input channel (Si), clock channel (ck) and configuration channel (Sh) of the Boundary Scan chain are linked to logic gates which are able to link, according to a control signal (ATPG-mode), these channels (Si, ck, Sh) or else to the input channel (Si), clock channel (ck) and configuration channel (Sh) of the TAP controller or else to the input channel (Si), clock channel (ck) and configuration channel (Sh) of the activation path.

8. Process according to claim 1 or claim 2, characterized in that all the memory points are linked in series.

9. Process according to claim 1 or claim 2, characterized in that at least some of the inputs/outputs of the integrated circuit are connected directly to a tester able to inject chosen signals directly into certain of these inputs/outputs, and/or to receive output signals directly from certain of these inputs/outputs and to compare these output signals with expected signals.

10. Process according to claim 1, claim 2 or claim 9, characterized in that the injection and/or direct measurement tester is coordinated with a device for controlling the Boundary Scan chin so as to generate test vectors on sets comprising both inputs/outputs connected directly to the tester and also inputs/outputs connected to the tester via the Boundary Scan chain.

11. Process according to claim 1 or claim 2, characterized in that the circuit comprises accesses to its set of memory points and in that the test is carried out by controlling the set of memory points so that the function of the integrated circuit is reduced to a combinatorial function.

12. Integrated circuit comprising a Boundary Scan chain and an access path to at least one memory point, characterized in that the access path and the Boundary Scan chain are linked in series and in that the circuit comprises means for intervening simultaneously on the memory point or points of the access path and on the cells of the Boundary Scan chain.

13. Integrated circuit according to claim 12, characterized in that the means for intervening simultaneously on the memory point or points of the access path and on the cells of the Boundary Scan chain comprise at least one logic gate able to link the Boundary Scan chain or else to the access path, or else to a TAP controller.

14. Integrated circuit according to claim 12 or claim 13, characterized in that the input channel (SI), clock channel) (CK) and configuration channel (SHIFT) of the Boundary Scan chain are linked to logic gates which are able to link, according to a control signal (MODE), these channels or else to the input channel (SI), clock channel (CK) and configuration channel (SHIFT) of the TAP controller, or else to the input channel (ATPG_si), clock channel (ATPG_ck) and configuration channel (ATPQ_se) of the access path.

15. Integrated circuit according to claim 12 or claim 13, characterized in that all the memory points of the integrated circuit are linked in series.

16. Integrated circuit tester, comprising:
   a first module means for imposing and/or reading states of memory points of an integrated circuit,
   a second module means for imposing states and/or reading states of input/output cells by way of the Boundary Scan chain of the circuit simultaneously with the action of the first module.

17. Integrated circuit tester according to claim 16, comprising means for simultaneously injecting into an integrated circuit, control signals (SI) for the memory points and control signals (SI) for the inputs/outputs of the Boundary Scan.

18. Tester according to claim 16, comprising means for injecting the control signals for the memory points and the control signals for the inputs/outputs of the Boundary Scan onto one and the same channel.

19. Tester according to any one of claim 16 to 18, comprising:
   a series of channels coupled directly to inputs/outputs of an integrated circuit, and
   a module means for injecting chosen signals directly into certain of the inputs/outputs, and/or to receive output signals from the inputs/outputs so as to compare the output signals with expected signals.

20. Tester according to claim 19, comprising:
   a control device for the Boundary Scan chain of an integrated circuit coordinated with the direct injection/reception module so as to generate test vectors on sets comprising both inputs/outputs connected directly to the tester and also inputs/outputs connected to the tester via the Boundary Scan chain.

21. Tester according to one of claims 16 to 18, comprising means for controlling the set of memory points in such a way that the function of the integrated circuit is reduced to a combinatorial function during the test.

* * * * *